(12) United States Patent
Uhm et al.

(10) Patent No.: US 12,527,027 B2
(45) Date of Patent: Jan. 13, 2026

(54) SEMICONDUCTOR DEVICES

(71) Applicant: Samsung Electronics Co., Ltd., Suwon-si (KR)

(72) Inventors: Sanghoon Uhm, Suwon-si (KR); Minhee Cho, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 439 days.

(21) Appl. No.: 18/141,060

(22) Filed: Apr. 28, 2023

(65) Prior Publication Data

US 2024/0030342 A1 Jan. 25, 2024

(30) Foreign Application Priority Data

Jul. 20, 2022 (KR) ........................ 10-2022-0089730

(51) Int. Cl.
*H10D 30/63* (2025.01)
*H01L 21/768* (2006.01)
(Continued)

(52) U.S. Cl.
CPC ....... *H10D 30/63* (2025.01); *H01L 21/76829* (2013.01); *H10D 30/6756* (2025.01); *H10D 30/689* (2025.01); *H10D 30/693* (2025.01)

(58) Field of Classification Search
CPC .. H10D 30/63; H10D 30/6756; H10D 30/689; H10D 30/693; H10D 30/6728; H10D 30/6755; H10D 86/423; H10D 86/60; H10D 62/40; H01L 21/76829; H01L 23/5283; H10B 12/033; H10B 12/315; H10B 12/05; H10B 12/482; H10B 12/30
See application file for complete search history.

(56) References Cited

U.S. PATENT DOCUMENTS 9,773,888 B2  9/2017  Pulugurtha et al.
10,096,706 B2  10/2018  Wang et al.
(Continued)

FOREIGN PATENT DOCUMENTS

TW   202201823 A   1/2022
TW   202228247 A   7/2022

OTHER PUBLICATIONS

Office Action dated Jan. 24, 2024 from the Taiwan Intellectual Property Office for corresponding Taiwanese Patent Application No. 112116128.

*Primary Examiner* — David Vu
(74) *Attorney, Agent, or Firm* — Muir Patent Law, PLLC

(57) ABSTRACT

A semiconductor device includes bit lines, gate electrodes, a gate insulation pattern and a channel structure on a substrate. Each of the bit lines extends in a first direction, and the bit lines may be spaced apart from each other in a second direction. The gate electrodes are spaced apart from each other in the first direction, and each of the gate electrodes extends in the second direction. For each of the gate electrodes, a gate insulation pattern is formed on a sidewall in the first direction of the gate electrode, and a channel structure is formed on a sidewall in the first direction of the gate insulation pattern. The channel structure includes a first amorphous channel including an amorphous oxide semiconductor and a first crystalline channel including a crystalline oxide semiconductor and contacting an upper surface of the first amorphous channel.

20 Claims, 18 Drawing Sheets

(51) Int. Cl.
*H10D 30/67* (2025.01)
*H10D 30/68* (2025.01)
*H10D 30/69* (2025.01)

(56) References Cited

U.S. PATENT DOCUMENTS

| | | |
|---|---|---|
| 11,139,396 B2 | 10/2021 | Karda et al. |
| 2017/0141124 A1 | 5/2017 | Hamanaka |
| 2020/0111919 A1* | 4/2020 | Karda ................ H10D 30/6755 |
| 2021/0143284 A1 | 5/2021 | Karda et al. |
| 2021/0217897 A1 | 7/2021 | Cho et al. |
| 2021/0391470 A1 | 12/2021 | Manfrini et al. |
| 2022/0102352 A1 | 3/2022 | Lee et al. |
| 2022/0223732 A1 | 7/2022 | Ryu et al. |

* cited by examiner

SEMICONDUCTOR DEVICES

CROSS-REFERENCE TO RELATED APPLICATION(S)

This application claims priority under 35 U.S.C. § 119 to Korean Patent Application No. 10-2022-0089730 filed on Jul. 20, 2022 in the Korean Intellectual Property Office, the disclosure of which is hereby incorporated by reference in its entirety.

BACKGROUND

1. Technical Field

Example embodiments of the present disclosure relate to semiconductor devices. More particularly, example embodiments of the present disclosure relate to memory devices including vertical channels.

2. Discussion of the Related Art

Memory devices including vertical channel transistors have been developed in order to increase the integration degree of the memory devices, and recently, oxide semiconductors have been used as a channel. Thus, a method of increasing the reliability of the electrical characteristics of a channel including an oxide semiconductor is needed.

SUMMARY

Example embodiments provide a semiconductor device having improved characteristics.

According to example embodiments of the inventive concepts, there is provided a semiconductor device. The semiconductor device may include bit lines, gate electrodes, a gate insulation pattern and a channel structure on a substrate. Each of the bit lines may extend in a first direction parallel to an upper surface of the substrate, and the bit lines may be spaced apart from each other in a second direction parallel to the upper surface of the substrate and crossing the first direction. The gate electrodes may be spaced apart from each other in the first direction, and each of the gate electrodes may extend in the second direction. For each of the gate electrodes, a gate insulation pattern may be formed on a sidewall in the first direction of the gate electrode, and a channel structure may be formed on a sidewall in the first direction of the gate insulation pattern. The channel structure may include a first amorphous channel including an amorphous oxide semiconductor and a first crystalline channel including a crystalline oxide semiconductor and contacting an upper surface of the first amorphous channel.

According to example embodiments of the inventive concepts, there is provided a semiconductor device. The semiconductor device may include bit lines, gate electrodes, a gate insulation pattern, a channel structure, an insulating interlayer pattern and an etch stop pattern on a substrate. Each of the bit lines may extend in a first direction parallel to an upper surface of the substrate, and the bit lines may be spaced apart from each other in a second direction parallel to the upper surface of the substrate and crossing the first direction. The gate electrodes may be spaced apart from each other in the first direction, and each of the gate electrodes may extend in the second direction. The gate insulation pattern may be formed on a sidewall in the first direction of each of the gate electrodes. The channel structure may be formed on a sidewall in the first direction of each of the gate insulation patterns. The insulating interlayer pattern and an etch stop pattern may be formed on a sidewall in the first direction of each of the channel structures, and the insulating interlayer pattern and the etch stop pattern may be stacked in a third direction perpendicular to the upper surface of the substrate. Each etch stop pattern may include an insulting material containing hydrogen.

According to example embodiments of the inventive concepts, there is provided a semiconductor device. The semiconductor device may include bit lines, gate electrodes, a gate insulation pattern, a channel structure, an insulating interlayer pattern, an etch stop pattern, a contact plug and a capacitor on a substrate. Each of the bit lines may extend in a first direction parallel to an upper surface of the substrate, and the bit lines may be spaced apart from each other in a second direction parallel to the upper surface of the substrate and crossing the first direction. The gate electrodes may be spaced apart from each other in the first direction, and each of the gate electrodes may extend in the second direction. The gate insulation pattern may be formed on a sidewall in the first direction of each of the gate electrodes. The channel structure may be formed on a sidewall in the first direction of each of the gate insulation patterns. The insulating interlayer pattern and an etch stop pattern may be formed on a sidewall in the first direction of each of the channel structures, and the insulating interlayer pattern and the etch stop pattern may be stacked in a third direction perpendicular to the upper surface of the substrate. The contact plug may contact an upper surface of each of the channel structures. The capacitor may be formed on the contact plug. Each channel structure may include a first amorphous channel including an amorphous oxide semiconductor, a first crystalline channel including a crystalline oxide semiconductor and contacting an upper surface of the first amorphous channel, a second crystalline channel including a crystalline oxide semiconductor and contacting a lower surface of the first amorphous channel, and a second amorphous channel including an amorphous oxide semiconductor. The second amorphous channel may contact an upper surface of each of the bit lines, and may be connected to the second crystalline channel.

The channel included in the semiconductor device may include a portion that may at least partially overlap a respective gate electrode in the horizontal direction and include a crystalline oxide semiconductor, and thus may the semiconductor device may have increased on-current.

DETAILED DESCRIPTION

The above and other aspects and features of a semiconductor device and a method of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

Hereinafter, in the specification (and not necessarily in the claims), two horizontal directions parallel to an upper surface of a substrate may be referred to as first and second directions D1 and D2, respectively, and a vertical direction perpendicular to the upper surface of the substrate may be referred to as a third direction D3. In example embodiments, the first and second directions are perpendicular to each other. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

Figure 1:
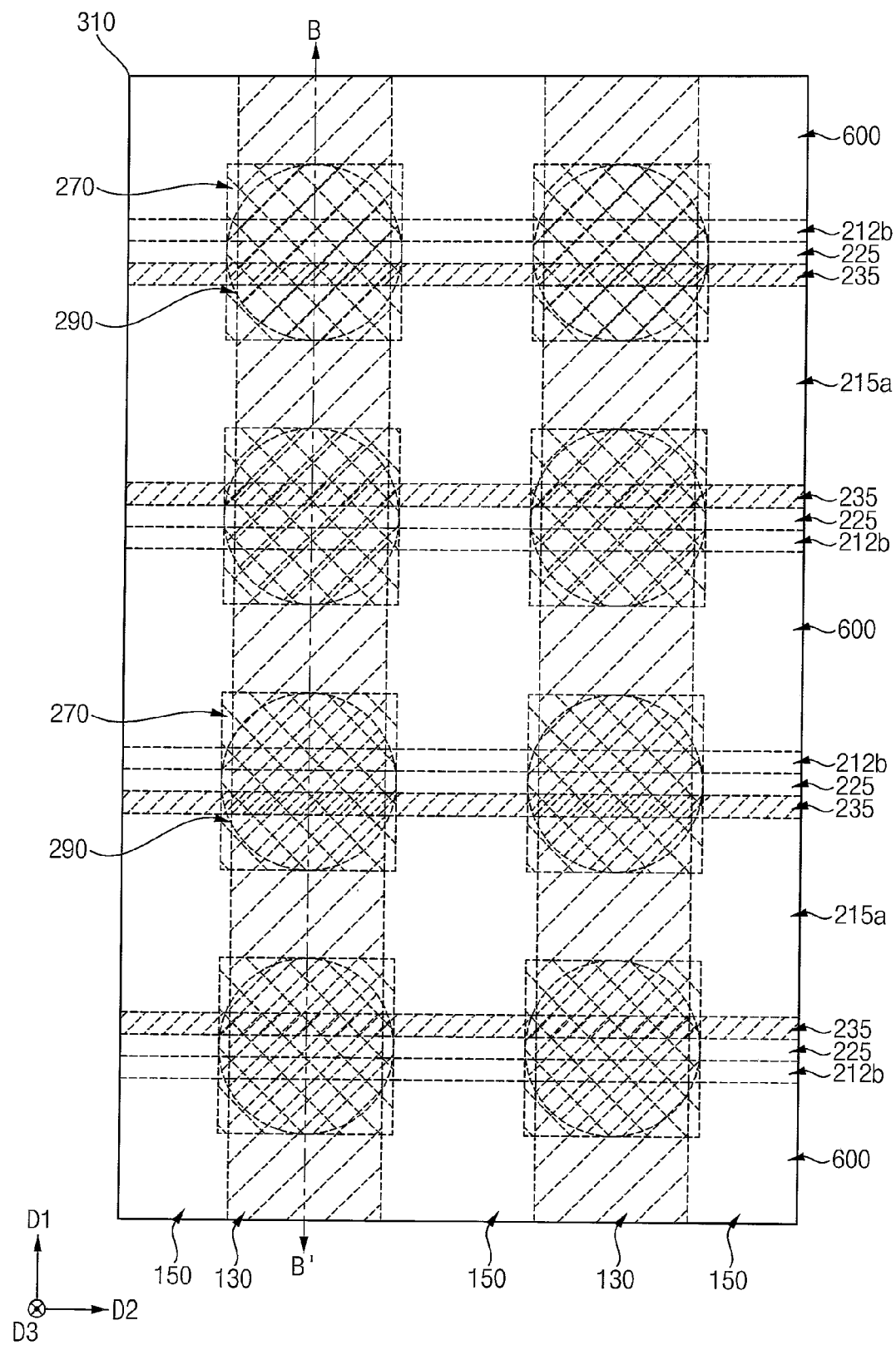
FIGS. 1 and 2 are a plan view and a cross-sectional view, respectively, illustrating a semiconductor device according to example embodiments.
Figure 2:
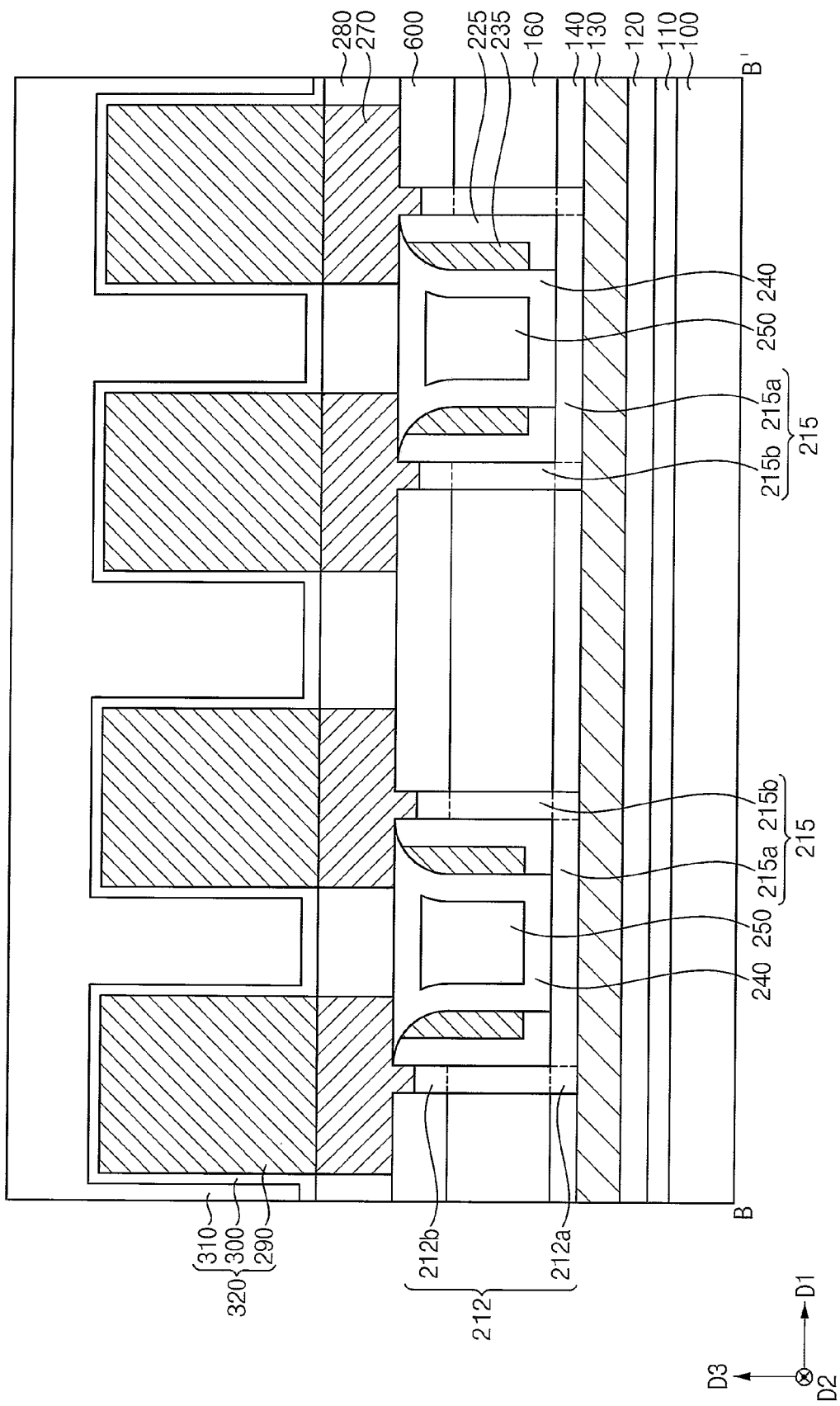

FIGS. 1 and 2 are a plan view and a cross-sectional view, respectively, illustrating a semiconductor device according to example embodiments. FIG. 2 is a cross-sectional view taken along line B-B' of FIG. 1.

Referring to FIGS. 1 and 2, the semiconductor device may include a bit line structure, a gate electrode 235, a gate insulation pattern 225, a channel structure, a contact plug 270 and a capacitor 320 on a substrate 100.

The semiconductor device may further include a first insulation layer 110, a fourth insulation pattern 240, and first to fourth insulating interlayer patterns 150, 160, 250 and 280.

The substrate 100 may include, e.g., a semiconductor material, an insulation material or a conductive material.

Figure 3:
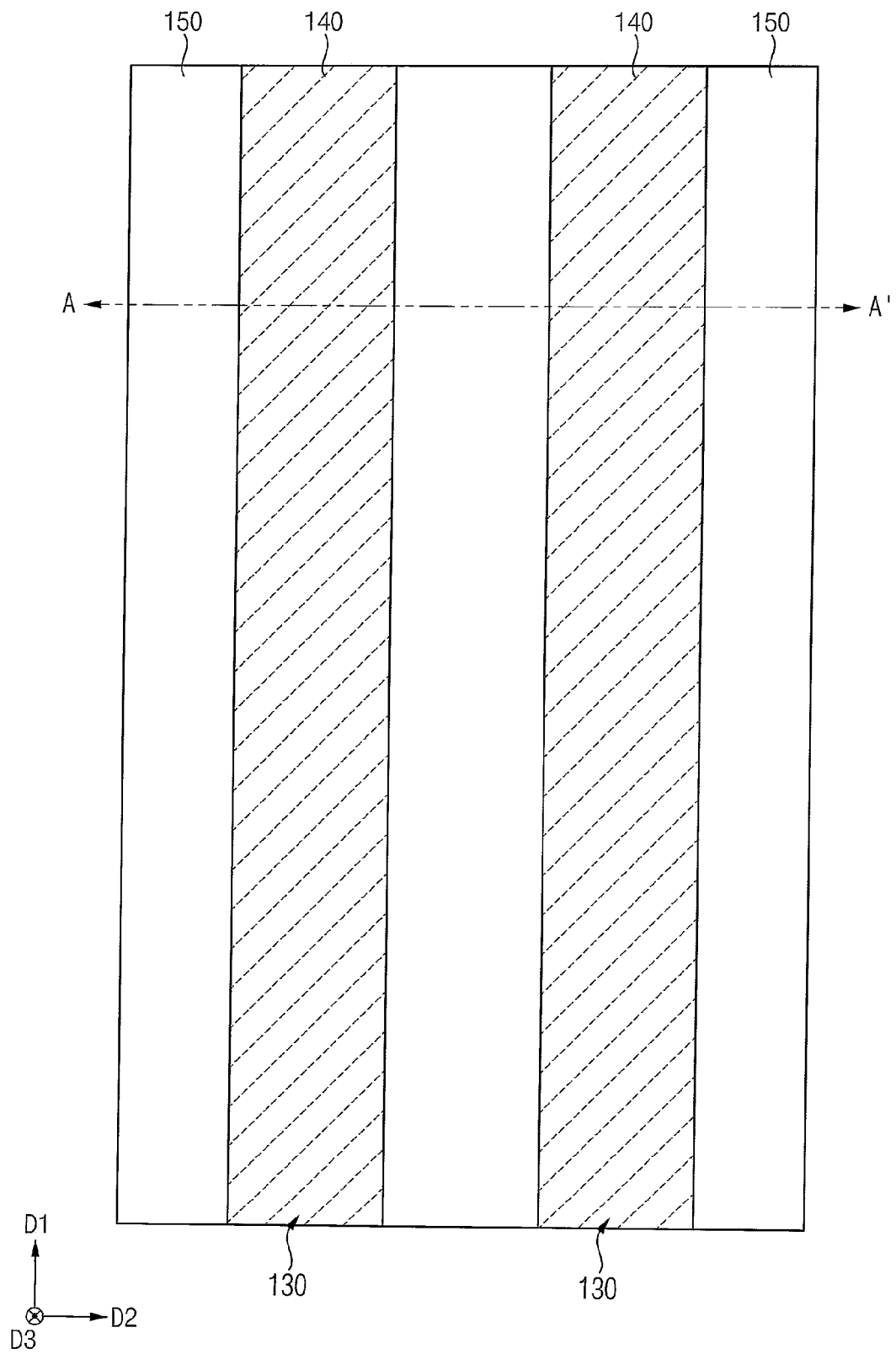
FIGS. 3 to 16 are plan views and cross-sectional views illustrating a method of manufacturing a semiconductor device in accordance with example embodiments.
Figure 4:
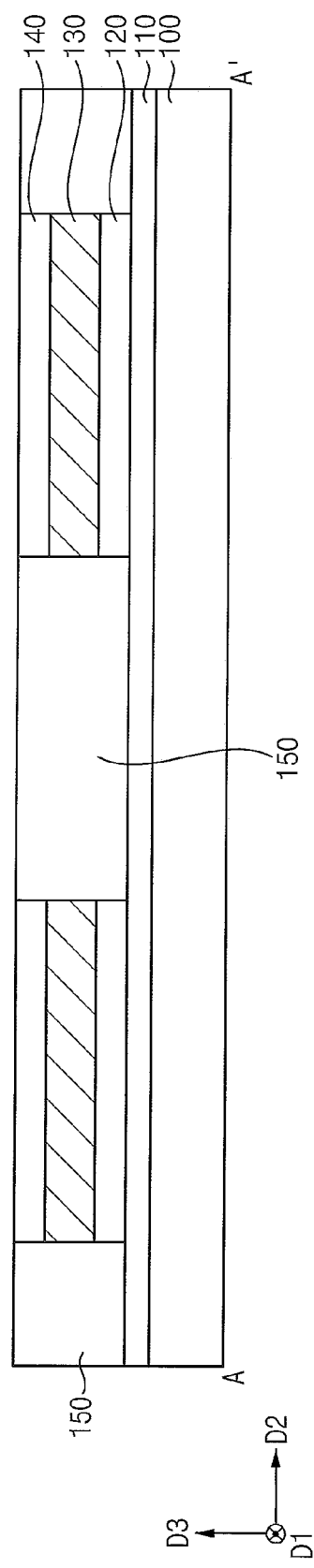

Referring to FIGS. 1 and 2 together with FIGS. 3 and 4, a first insulation layer 110 may be formed on the substrate 100, and the bit line structure may extend in the first direction D1 on the first insulation layer 110.

In example embodiments, the bit line structure may include a second insulation pattern 120, a bit line 130 and a third insulation pattern 140 sequentially stacked on the first insulation layer 110. Each of the second insulation pattern 120 and the bit line 130 may extend in the first direction D1, and a plurality of third insulation patterns 140 may be spaced apart from each other in the first direction D1 on the bit line 130.

In example embodiments, a plurality of bit line structures may be spaced apart from each other in the second direction D2, and the first insulating interlayer pattern 150 may extend in the first direction D1 on the first insulation layer 110 between neighboring ones of the bit line structures in the second direction D2.

Each of the first insulation layer 110 and the first insulating interlayer pattern 150 may include an oxide, e.g., silicon oxide, the bit line 130 may include a conductive material, e.g., a metal, a metal nitride, a metal silicide, and each of the second and third insulation patterns 120 and 140 may include an insulating nitride, e.g., silicon nitride.

The second insulating interlayer pattern 160 and the etch stop pattern 600 each of which may extend in the second direction D2 may be stacked in the third direction D3 on the third insulation pattern 140 and the first insulating interlayer pattern 150. Hereinafter, the third insulation pattern 140, the second insulating interlayer pattern 160 and the etch stop pattern 600 may be collectively referred to as a bar structure. In example embodiments, the bar structure may extend in the second direction D2, and a plurality of bar structures may be spaced apart from each other in the first direction D1.

The second insulating interlayer pattern 160 may include an oxide, e.g., silicon oxide. In example embodiments, the etch stop pattern 600 may include or be formed of, e.g., silicon nitride, silicon oxynitride, silicon oxycarbonitride, silicon oxycarbide, etc., and may include hydrogen.

The third insulating interlayer pattern 250 extending in the second direction D2 and the fourth insulation pattern 240 surrounding the third insulating interlayer pattern 250 may be formed between neighboring ones of the bar structures in the first direction D1, and the channel structure, the gate insulation pattern 225 and the gate electrode 235 may be sequentially stacked in the first direction D1 between the bar structure and the fourth insulation pattern 240.

The third insulating interlayer pattern 250 may include an oxide, e.g., silicon oxide, and the fourth insulation pattern 240 may include an insulating nitride, e.g., silicon nitride.

The channel structure may extend in the second direction D2, and may contact upper surfaces of the bit line 130 and the first insulating interlayer pattern 150. Alternatively, a plurality of channel structures may be spaced apart from each other in the second direction D2, and each of the channel structures may contact the upper surface of the bit line 130. The channel structure may further contact sidewalls of neighboring ones of the bar structures in the first direction D1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In example embodiments, the channel structure may include an amorphous channel 215 containing an amorphous oxide semiconductor and a crystalline channel 212 containing a crystalline oxide semiconductor.

In example embodiments, the amorphous channel 215 may include a vertical portion 215*b* and a horizontal portion 215*a*, which may also be referred to as first and second amorphous channels 215*b* and 215*a*, respectively. An outer sidewall of the first amorphous channel 215*b* may contact a sidewall of the second insulating interlayer pattern 160, and a lower surface of the second amorphous channel 215*a* may contact an upper surface of the bit line 130.

In example embodiments, the crystalline channel 212 may include a lower portion 212*a* and an upper portion 212*b*, which may also be referred to as first and second crystalline channels 212*b* and 212*a*, respectively. An outer sidewall of the first crystalline channel 212*b* may contact a sidewall of the etch stop pattern 600, a lower surface of the second crystalline channel 212*a* may contact the upper surface of the bit line 130, and an outer sidewall of the second crystalline channel 212*a* may contact a sidewall of the third insulation pattern 140.

In example embodiments, the first crystalline channel 212*b*, the first amorphous channel 215*b*, the second crystalline channel 212*a* and the second amorphous channel 215*a* may be connected to each other, and may be integrally formed.

In example embodiments, a lower surface of the first crystalline channel 212b may be coplanar with a lower surface of the etch stop pattern 600, and an upper surface of the second crystalline channel 212a may be coplanar with an upper surface of the third insulation pattern 140.

In example embodiments, each of the crystalline channel 212 and the amorphous channel 215 may include at least one of zinc tin oxide (ZTO), indium zinc oxide (IZO), zinc oxide ($ZnO_x$), indium gallium zinc oxide (IGZO), indium gallium silicon oxide (IGSO), Indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_a$), indium gallium zinc oxide ($In_xGa_yZnO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_zZn_ySn_zO_a$), gallium zinc tin oxide ($Ga_xZn_ySn_zO_a$), zirconium zinc tin oxide ($Zr_xZn_ySn_zO_a$), and indium gallium silicon oxide (InGaSiO).

In example embodiments, the crystalline channel 212 may include hydrogen, and may have a carrier concentration greater than that of the amorphous channel 215.

In example embodiments, the channel structures on the respective sidewalls of two bar structures neighboring in the first direction D1, which may form a bar structure pair, may be connected with each other. For example, the second amorphous channels 215a included in the channel structures, respectively, neighboring in the first direction D1 may be connected to each other.

The gate insulation pattern 225 may extend in the second direction D2, and may contact an inner sidewall of the channel structure, and an upper surface of the second amorphous channel 215a on the bit line 130. In example embodiments, a cross-section of the gate insulation pattern 225 in the first direction D1 may have an "L" shape.

The gate electrode 235 may extend in the second direction D2, and may contact an inner sidewall of the gate insulation pattern 225, and an upper surface of a portion of the gate insulation pattern 225 on the second amorphous channel 215a. The gate electrode 235 may include a conductive material, e.g., a metal, a metal nitride, a metal silicide, etc.

In example embodiments, an uppermost surface of the gate electrode 235 may be higher than an upper surface of the first amorphous channel 215b and a lower surface of the etch stop pattern 600. Thus, the etch stop pattern 600 and the first amorphous channel 215b may overlap at least a portion of the gate electrode 235 in the first direction D1.

In example embodiments, an uppermost surface of the gate electrode 235 may be higher than an upper surface of the first crystalline channel 212b. Thus, the first crystalline channel 212b may partially overlap the gate electrode 235 in the first direction D1.

The contact plug 270 may contact an upper surface of the channel structure at each of areas where the bit lines 130 and the gate electrodes 235 cross each other in the third direction D3. The contact plug 270 may contact upper surfaces of the gate insulation pattern 225, the etch stop pattern 600 and the fourth insulation pattern 240 adjacent to the channel structure, and may be spaced apart from an upper surface of the gate electrode 235.

In example embodiments, a plurality of contact plugs 270 may be spaced apart from each other in the first and second directions D1 and D2, and may be arranged in a lattice pattern or a honeycomb pattern in a plan view.

In example embodiments, the contact plug 270 may include a lower portion contacting the upper surface of the channel structure and having a first width in the first direction D1 and an upper portion contacting the lower portion of the contact plug 270 and having a second width in the first direction D1 that is greater than the first width. A lower surface of the contact plug 270 may be lower than the upper surfaces of the gate insulation pattern 225 and the etch stop pattern 600.

The contact plug 270 may include a conductive material, e.g., a metal, a metal nitride, a metal silicide, etc.

The fourth insulating interlayer pattern 280 may be formed on the etch stop pattern 600, the gate insulation pattern 225 and the fourth insulation pattern 240, and may cover a sidewall of the contact plug 270. The fourth insulating interlayer pattern 280 may include an oxide, e.g., silicon oxide.

The capacitor 320 may include first and second capacitor electrodes 290 and 310 and a dielectric layer 300 therebetween. The first capacitor electrode 290 may be formed on the contact plug 270, the dielectric layer 300 may be formed on an upper surface and a sidewall of the first capacitor electrode 290 and an upper surface of the fourth insulating interlayer pattern 280, and the second capacitor electrode 310 may be formed on the dielectric layer 300.

As the plurality of contact plugs 270 are spaced apart from each other in the first and second directions D1 and D2, a plurality of first capacitor electrodes 290 may be spaced apart from each other in the first and second directions D1 and D2.

In example embodiments, the first capacitor electrode 290 may have a shape of a circle, an ellipse, a polygon, a polygon with rounded corners, etc., in a plan view. The first capacitor electrodes 290 may be arranged in a lattice pattern or a honeycomb pattern in a plan view.

In the semiconductor device, current may flow in the third direction D3, that is, in the vertical direction in the channel structure between the bit line 130 and the contact plug 270, and thus the semiconductor device may include a vertical channel transistor (VCT) having a vertical channel.

In example embodiments, the channel structure may include the crystalline channel 212 at least partially overlapping the gate electrode 235 in the first direction D1. For example, the first crystalline channel 212b of the crystalline channel 212 may partially overlap the gate electrode 235 in the first direction D1. The crystalline channel 212 may include crystals having sizes greater than those of crystals in the amorphous channel 215, and may have a carrier concentration greater than that of the amorphous channel 215. Thus, the VCT including the channel structure containing the crystalline channel 212 may have an increased on-current.

FIGS. 3 to 16 are plan views and cross-sectional views illustrating a method of manufacturing a semiconductor device in accordance with example embodiments. Particularly, FIGS. 3, 5, 8, 11, 13 and 15 are the plan views, and FIG. 4 is a cross-sectional view taken along line A-A' of FIG. 3, and FIGS. 6, 7, 9, 10, 12, 14 and 16 are cross-sectional views taken along lines B-B' of corresponding plan views, respectively.

Referring to FIGS. 3 and 4, a first insulation layer 110, a second insulation layer, a bit line layer and a third insulation layer may be sequentially stacked on a substrate 100, and the third insulation layer, the bit line layer and the second insulation layer may be patterned to form a third insulation pattern 140, a bit line 130 and a second insulation pattern 120, respectively.

In example embodiments, the third insulation layer may include silicon nitride, silicon oxynitride, silicon oxycarbonitride, silicon oxycarbide, etc. In an example embodiment, the third insulation layer may be formed by a chemical vapor deposition (CVD) process or an atomic layer deposition (ALD) process using, e.g., silane ($SiH_4$) gas, nitrogen trifluoride ($NF_3$) gas or argon (Ar) gas, etc., and thus may include silicon nitride containing hydrogen.

In some embodiments, after forming the third insulation layer by a deposition process, hydrogen ions may be doped into the third insulation layer.

The second insulation pattern 120, the bit line 130 and the third insulation pattern 140 sequentially stacked on the substrate 100 may be referred to as a bit line structure. In example embodiments, the bit line structure may extend in the first direction D1 on the substrate 100, and a plurality of bit line structures may be spaced apart from each other in the second direction D2. Thus, a first opening may be formed between neighboring ones of the bit line structures in the second direction D2 to expose an upper surface of the first insulation layer 110.

A first insulating interlayer may be formed on the bit line structures and the first insulation layer 110 to fill the first opening, and an upper portion of the first insulating interlayer may be planarized until upper surfaces of the bit line structures are exposed. Thus, the first insulating interlayer pattern 150 extending in the first direction D1 may be formed between the bit line structures.

In example embodiments, the planarization process may include a chemical mechanical polishing (CMP) process and/or an etch back process.

Figure 5:
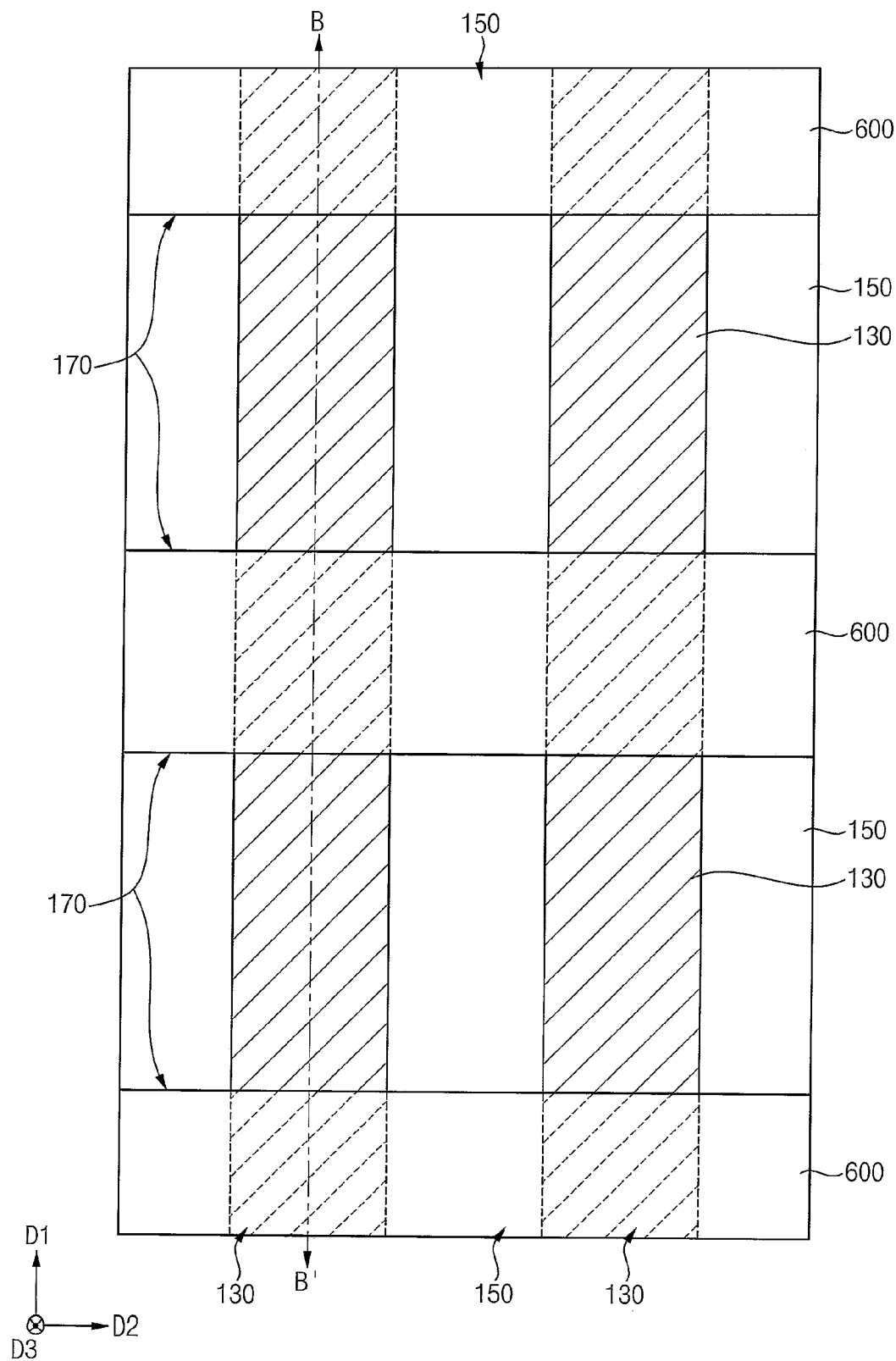
Figure 6:
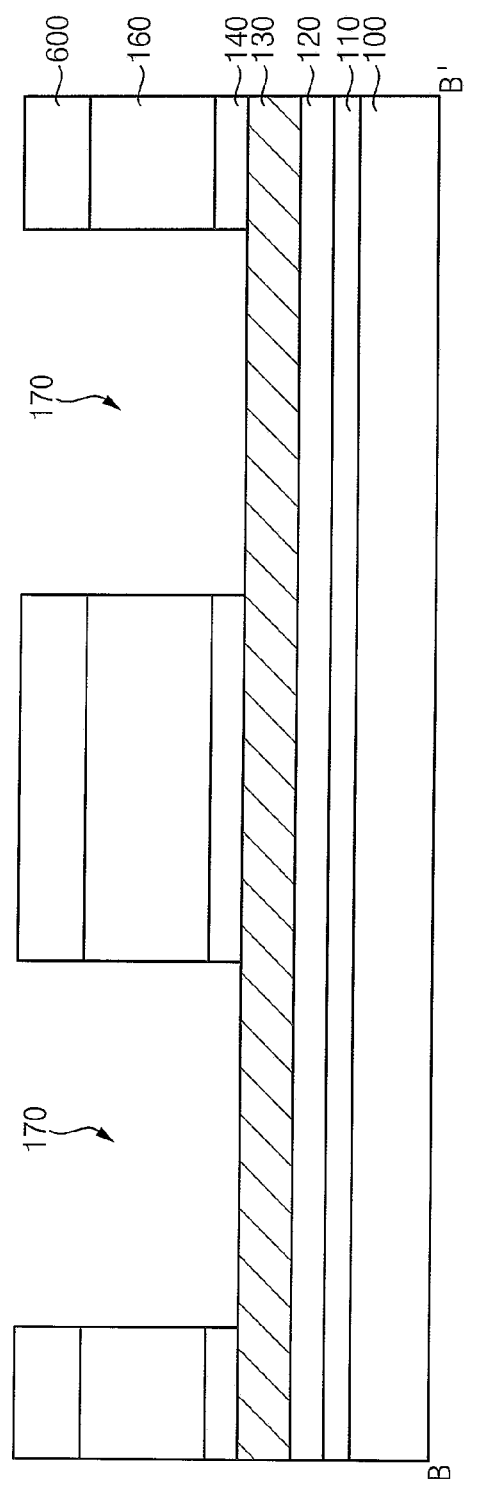

Referring to FIGS. 5 and 6, a second insulating interlayer and an etch stop layer may be sequentially formed on the bit line structures and the first insulating interlayer patterns 150, and the etch stop layer and the second insulating interlayer may be partially removed by, e.g., a dry etching process to form a second opening 170 extending in the second direction D2 and exposing upper surfaces of the third insulation pattern 140 and the first insulating interlayer pattern 150.

Thus, the etch stop layer may be divided into a plurality of etch stop patterns 600, each of which may extend in the second direction D2, spaced apart from each other in the first direction D1, and the second insulating interlayer may be divided into a plurality of second insulating interlayer patterns 160, each of which may extend in the second direction D2, spaced apart from each other in the first direction D1.

In example embodiments, the etch stop layer may include or be formed of silicon nitride, silicon oxynitride, silicon oxycarbonitride, silicon oxycarbide, etc. In an example embodiment, the etch stop layer may be formed by a chemical vapor deposition (CVD) process or an atomic layer deposition (ALD) process using, e.g., silane ($SiH_4$) gas, nitrogen trifluoride ($NF_3$) gas or argon (Ar) gas, etc., and thus may include silicon nitride containing hydrogen.

In some embodiments, after forming the etch stop layer by a deposition process, hydrogen ions may be doped into the etch stop layer.

A portion of the third insulation pattern 140 exposed by the second opening 170 may be removed so that the third insulation pattern 140 extending in the first direction D1 may be divided into a plurality of parts spaced apart from each other in the first direction D1, and an upper portion of the first insulating interlayer pattern 150 exposed by the second opening 170 may also be removed.

Hereinafter, the third insulation pattern 140, the second insulating interlayer pattern 160 and the etch stop pattern 600 sequentially stacked in the third direction D3 may be collectively referred to as a bar structure. In example embodiments, the bar structure may extend in the second direction D2, and a plurality of bar structures may be spaced apart from each other in the first direction D1.

Figure 7:
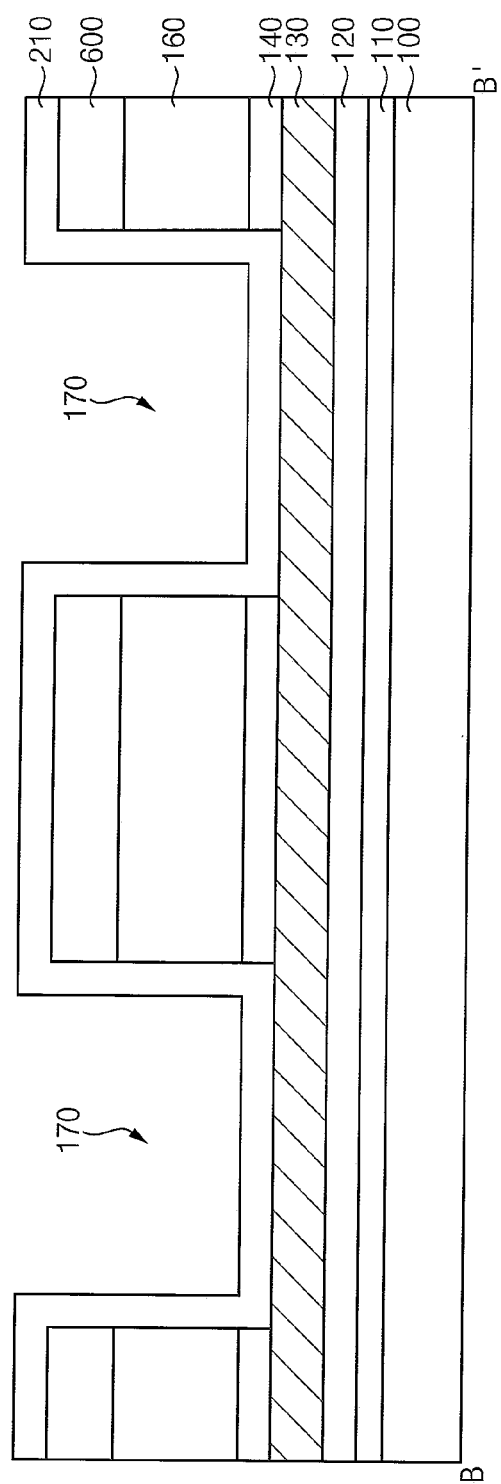

Referring to FIG. 7, a channel layer 210 may be formed on upper surfaces of the bit line 130 and the first insulating interlayer pattern 150 exposed by the second opening 170 and a sidewall and an upper surface of the bar structure.

In example embodiments, the channel layer 210 may be formed by a deposition process, e.g., an ALD process, a CVD process, etc., at a relatively low temperature, and may include an amorphous oxide semiconductor.

Figure 8:
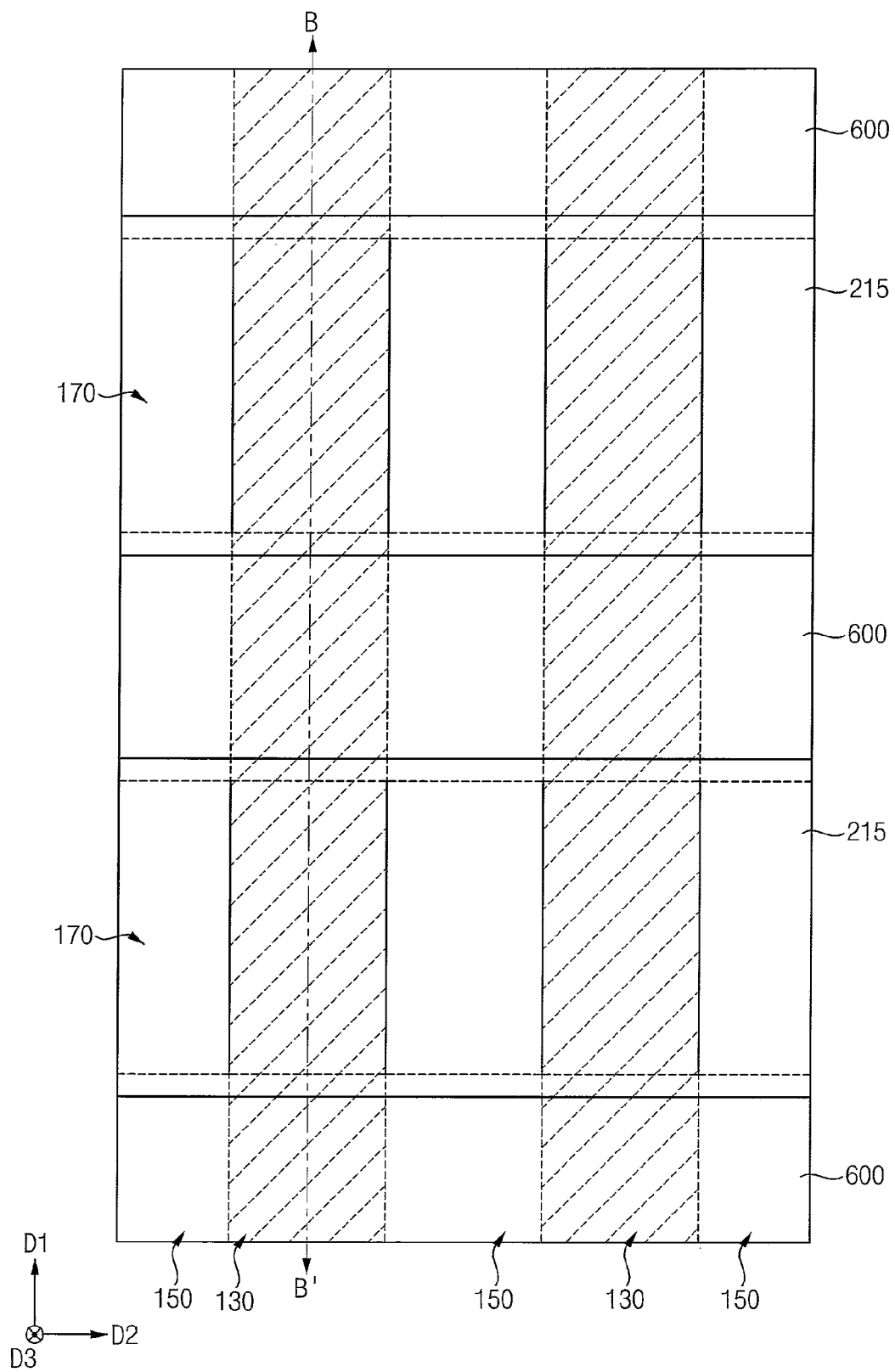
Figure 9:
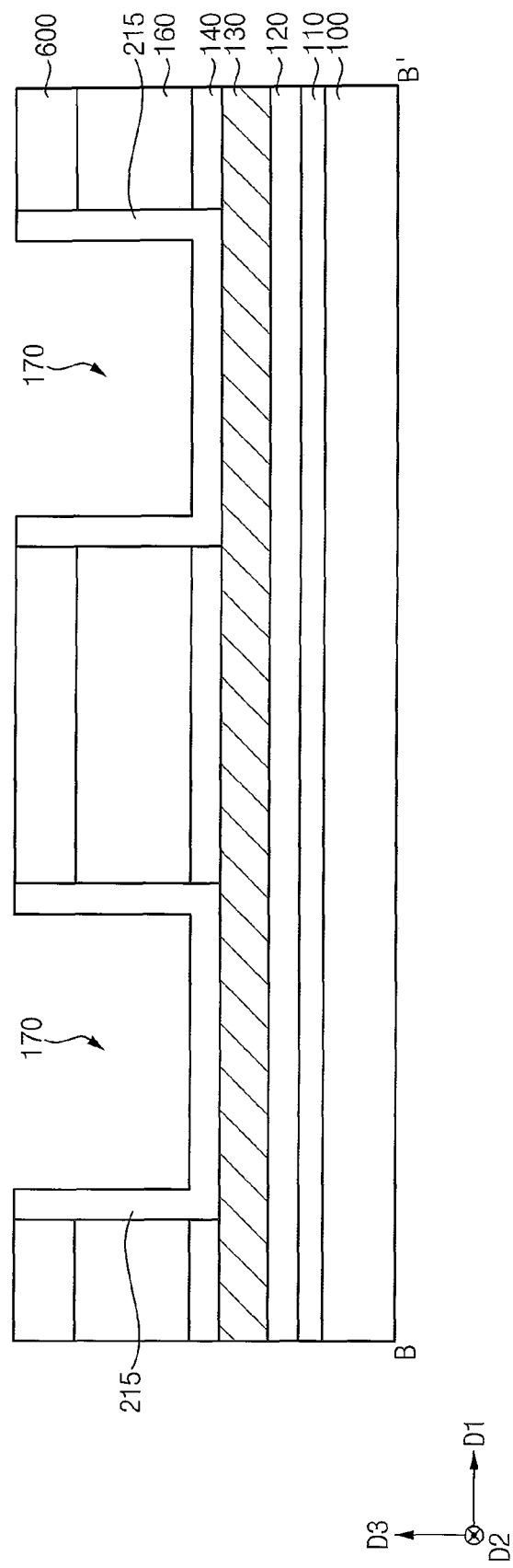

Referring to FIGS. 8 and 9, a portion of the channel layer 210 on the upper surface of the bar structure may be removed to form an amorphous channel 215 on the upper surfaces of the bit line 130 and the first insulating interlayer pattern 150 and the sidewall of the bar structure.

In example embodiments, a sacrificial layer may be formed on the channel layer 210 to fill the second opening 170, an etching mask may be formed on the sacrificial layer, and a dry etching process may be performed using the etching mask on the channel layer 210, so that the portion of the channel layer 210 on the upper surface of the bar structure may be removed.

During the dry etching process, the etch stop pattern 600 on the second insulating interlayer pattern 160 may prevent the second insulating interlayer pattern 160 from being removed.

The sacrificial layer may include, e.g., spin-on-hardmask (SOH), amorphous carbon layer (ACL), etc., and after forming the amorphous channel 215, the sacrificial layer may be removed by, e.g., an ashing process and/or a stripping process.

In example embodiments, the amorphous channel 215 may extend in the second direction D2, and a plurality of amorphous channels 215 may be spaced apart from each other in the first direction D1.

Figure 10:
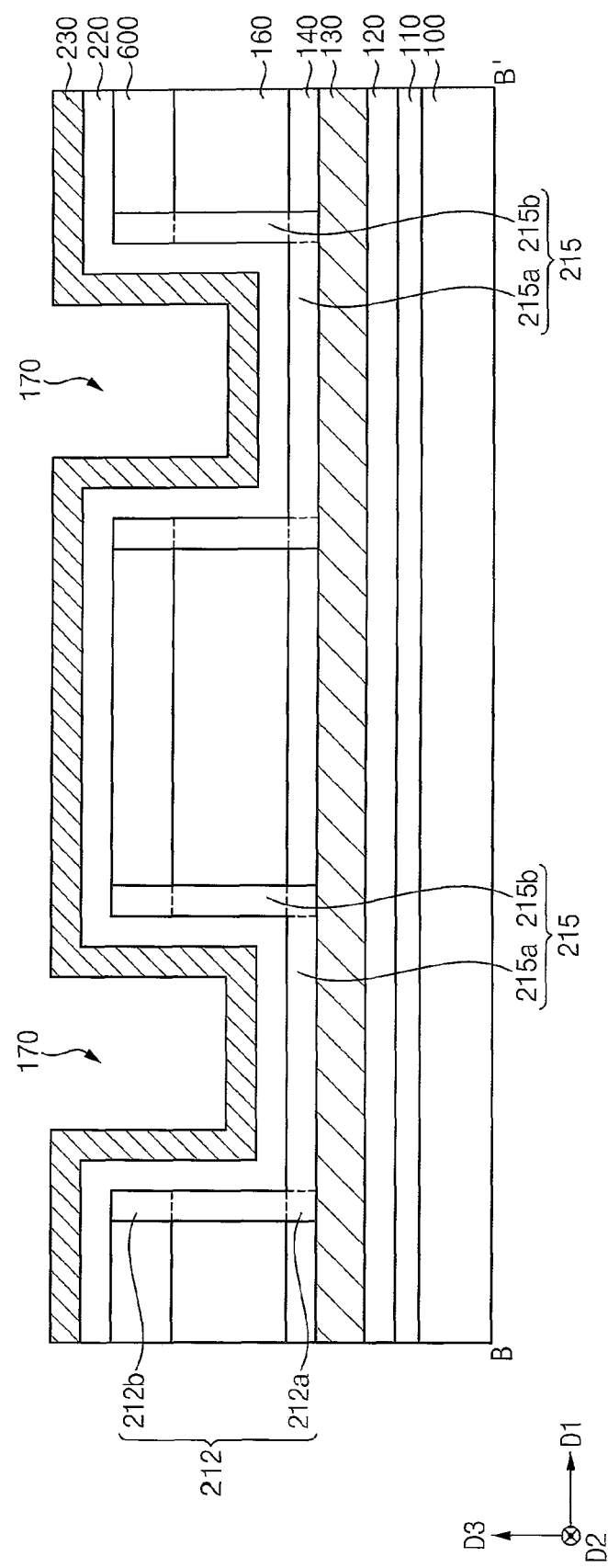

Referring to FIG. 10, a gate insulation layer 220 and a gate electrode layer 230 may be sequentially formed on the amorphous channel 215 and the etch stop pattern 600.

In example embodiments, the gate insulation layer 220 and the gate electrode layer 230 may be formed by a deposition process, e.g., a CVD process, an ALD process, etc., at a relatively high temperature.

Thus, hydrogen contained in the etch stop pattern 600 and the third insulation pattern 140 may diffuse into a portion of the amorphous channel 215 adjacent thereto, so that an oxide semiconductor included in the amorphous channel 215 may be crystallized. For example, heat generated by the deposition process for forming the gate insulation layer 220 and the gate electrode layer 230 may be provided to the etch stop pattern 600, the third insulation pattern 140 and the amorphous channel 215, so that hydrogen contained in the etch stop pattern 600 and the third insulation pattern 140 may diffuse into the amorphous channel 215 to expedite the crystallization of the amorphous channel 215.

Hereinafter, a portion of the amorphous channel 215 that is adjacent to the etch stop pattern 600 and includes a crystalline oxide semiconductor may be defined as a crystalline channel 212, and the crystalline channel 212 and the amorphous channel 215 may be collectively defined as a channel structure. The crystalline channel 212 may include or be formed of a crystalline oxide semiconductor that may contain hydrogen.

In example embodiments, the amorphous channel 215 may include a horizontal portion 215a on the upper surface of the bit line 130 and extending in the second direction D2, and a vertical portion 215b on the sidewall of the second insulating interlayer pattern 160 and extending in the second direction D2. The crystalline channel 212 may include a lower portion 212a beneath a lower surface of the vertical portion 215b of the amorphous channel 215 and extending in the second direction D2 to contact the sidewall of the third insulation pattern 140, and an upper portion 212b on an upper surface of the vertical portion 215b of the amorphous channel 215 and extending in the second direction D2 to contact the sidewall of the etch stop pattern 600.

Figure 11:
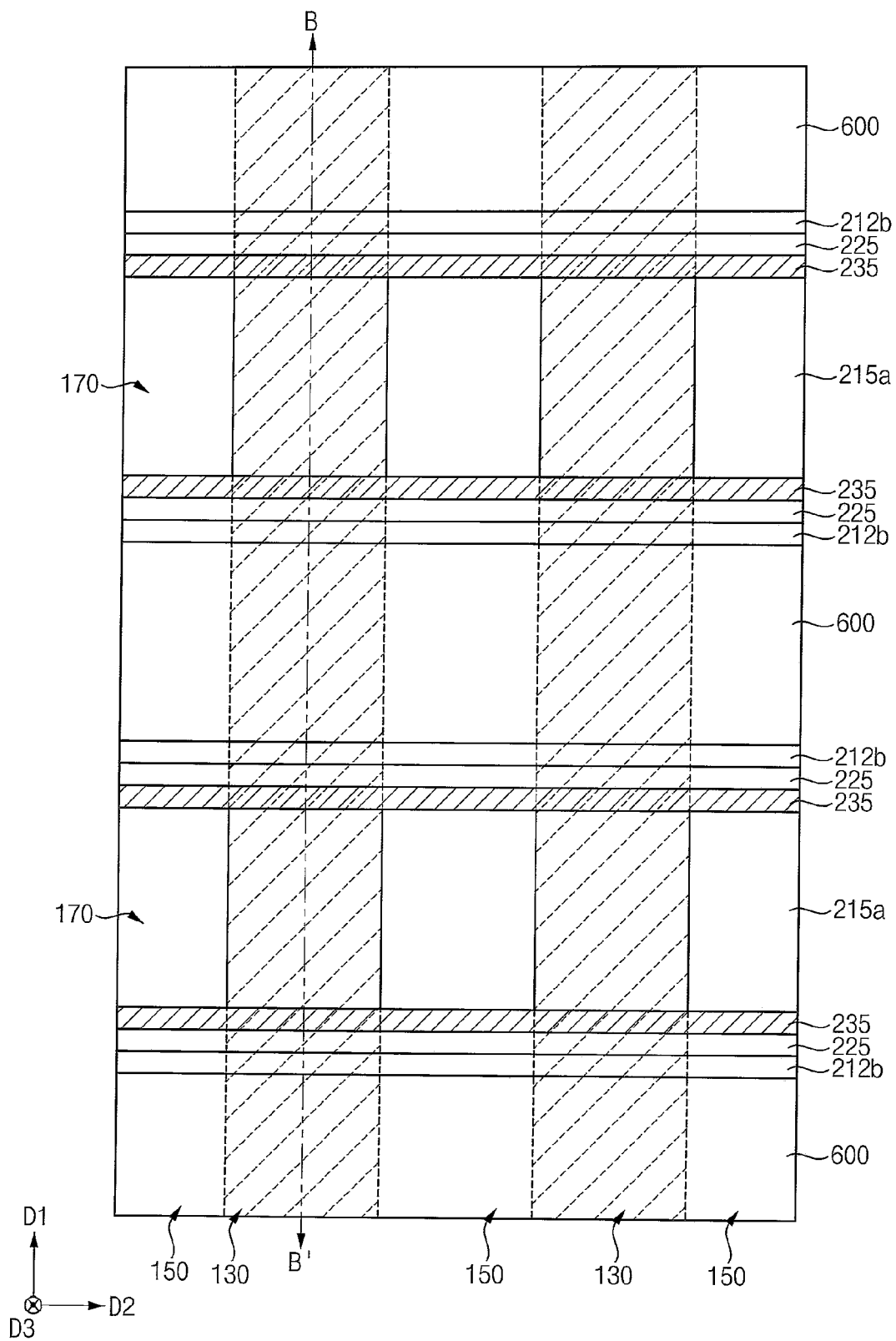
Figure 12:
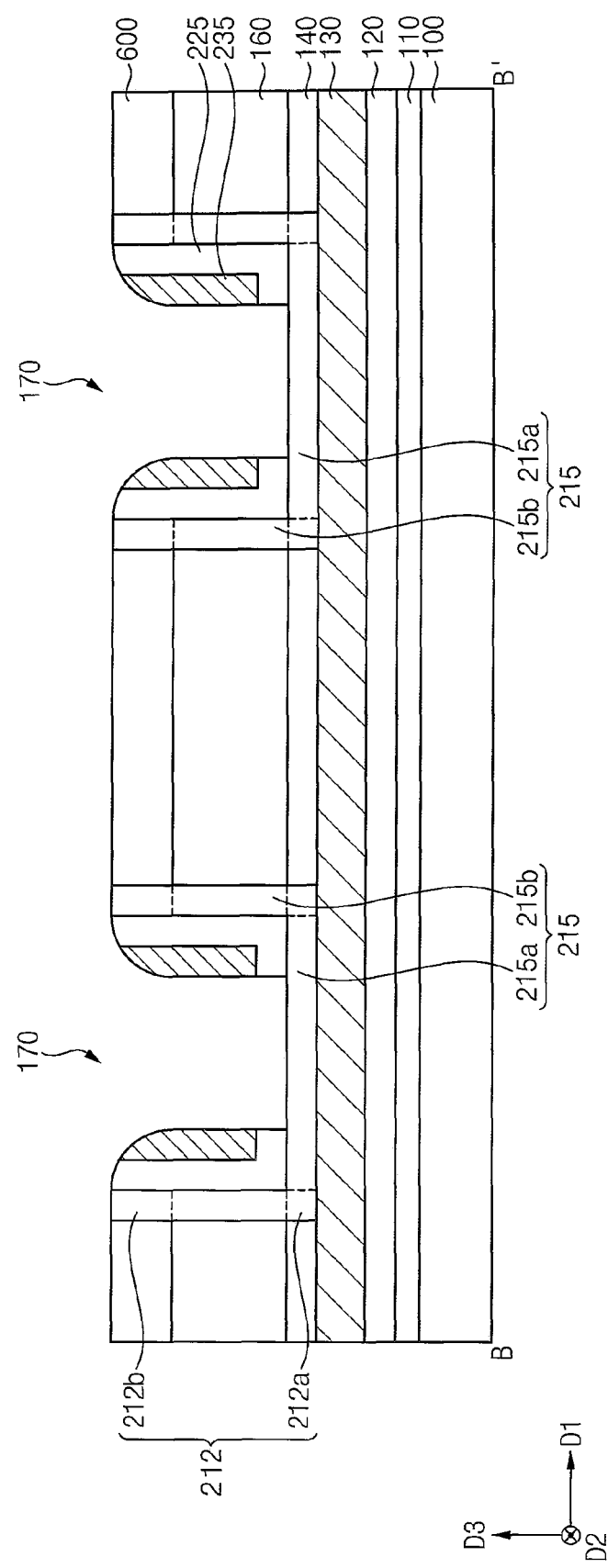

Referring to FIGS. 11 and 12, the gate electrode layer 230 and the gate insulation layer 220 may be anisotropically etched to form a gate electrode 235 and a gate insulation pattern 225, respectively.

In example embodiments, an outer sidewall of the gate insulation pattern 225 may contact an inner sidewall of the channel structure and an upper surface of an edge portion in the first direction D1 of the channel structure. In example embodiments, a cross-section of the gate insulation pattern 225 in the first direction D1 may have an "L" shape.

An outer sidewall of the gate electrode 235 may contact an inner sidewall of the gate insulation pattern 225 and an upper surface of a portion of the gate insulation pattern 225 that is on the upper surface of the edge portion of the channel structure.

Figure 13:
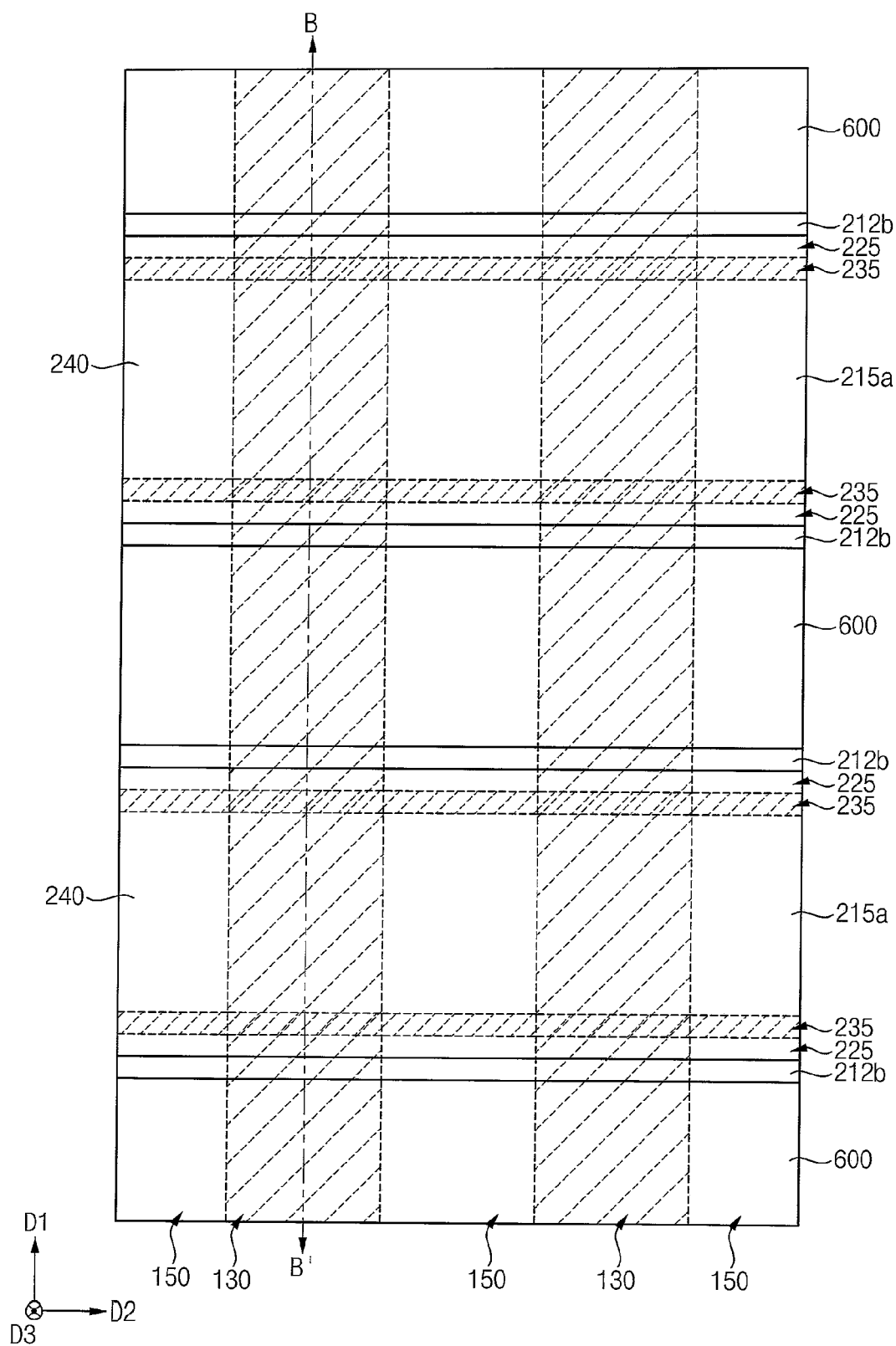
Figure 14:
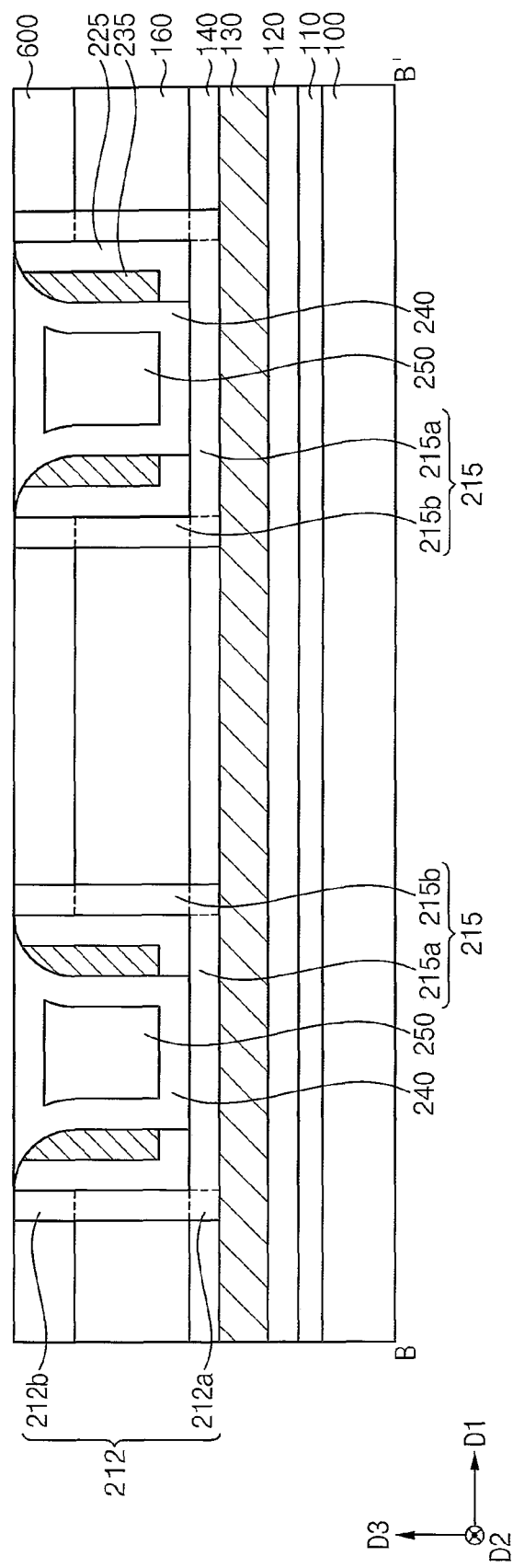

Referring to FIGS. 13 and 14, a fourth insulation layer may be formed on the channel structure, the gate insulation pattern 225, the gate electrode 235 and the etch stop pattern 600, a third insulating interlayer may be formed on the fourth insulation layer to fill a remaining portion of the second opening 170, and upper portions of the third insulating interlayer and the fourth insulation layer may be removed until an upper surface of the etch stop pattern 600 is exposed, by, e.g., a wet etching process or a dry etching process. Thus, the third insulating interlayer may remain in the second opening 170 as a third insulation pattern 250.

An additional fourth insulation layer may be formed on the third insulating interlayer pattern 250, the fourth insulation layer, the channel structure, the gate insulation pattern 225, the gate electrode 235 and the etch stop pattern 600, and may be planarized until the upper surface of the etch stop pattern 600 is exposed.

Thus, a fourth insulation pattern 240 may be formed in the second opening 170 to surround the third insulating interlayer pattern 250.

Figure 15:
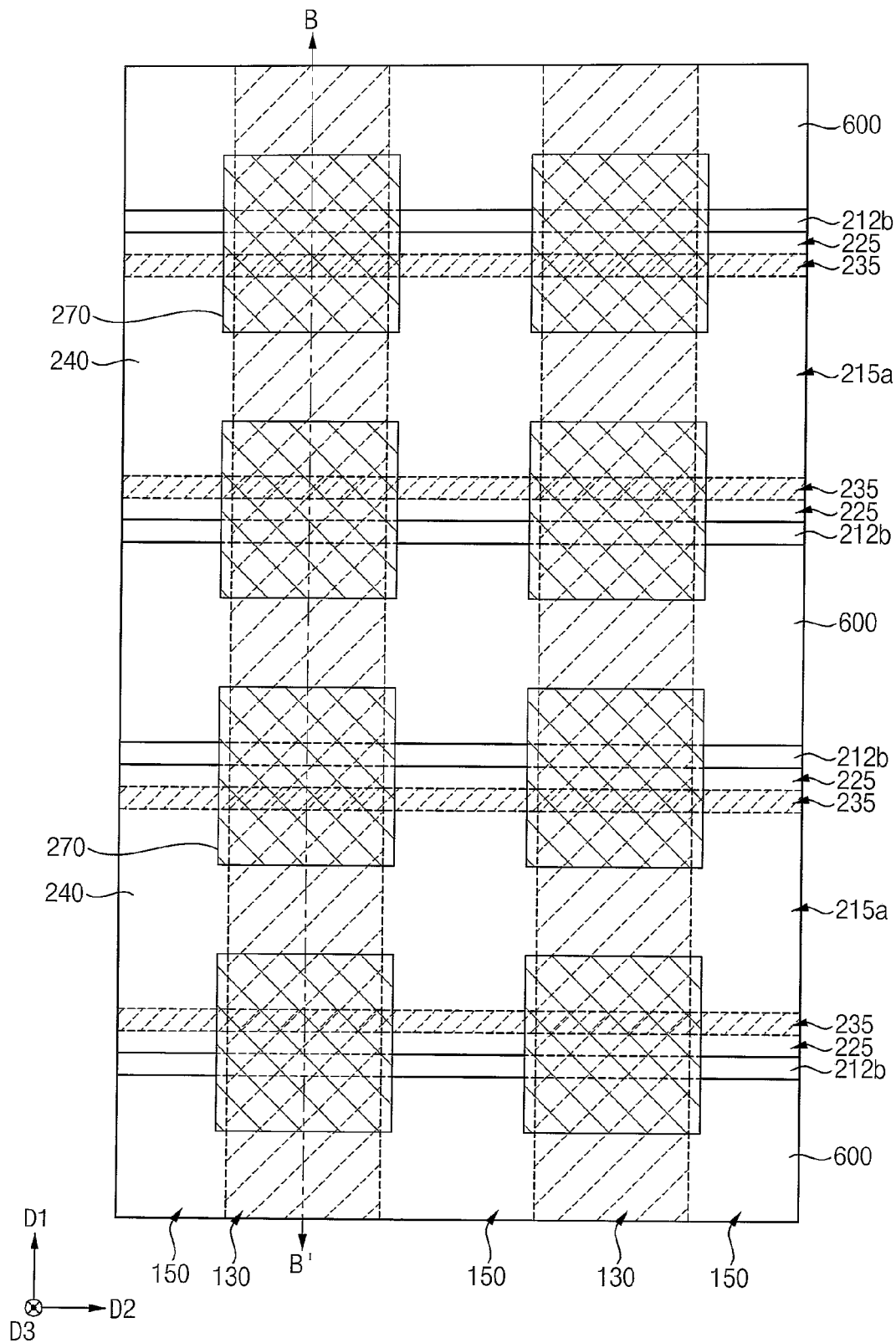
Figure 16:
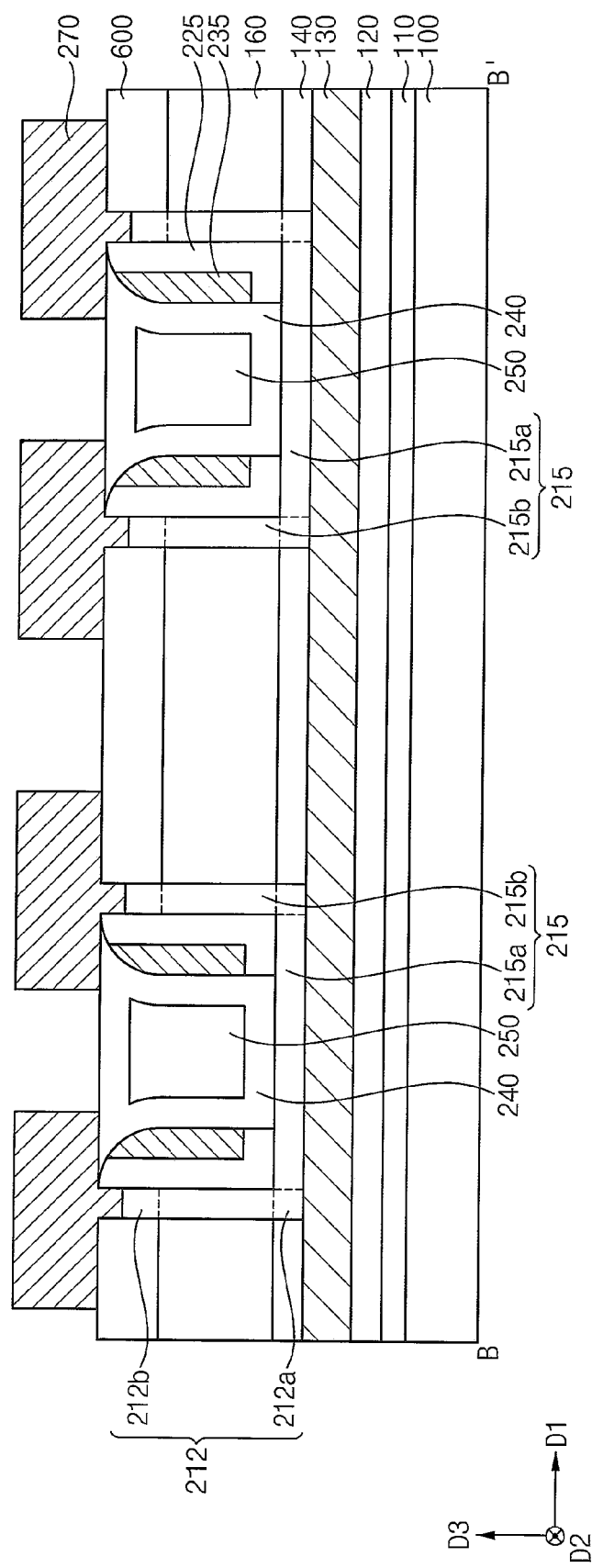

Referring to FIGS. 15 and 16, the upper portion 212b of the crystalline channel 212 may be partially removed by, e.g., a wet etching process to form a recess.

A contact plug layer may be formed on the fourth insulation pattern 240, the channel structure, the gate insulation pattern 225, the gate electrode 235 and the etch stop pattern 600 to fill the recess, and may be patterned to form a contact plug 270 contacting an upper surface of the upper portion 212b of the crystalline channel 212. In example embodiments, a plurality of contact plugs 270 may be formed to be spaced apart from each other in the first and second directions D1 and D2.

In an example embodiment, the contact plugs 270 may be arranged in a lattice pattern in a plan view. Alternatively, the contact plugs 270 may be arranged in a honeycomb pattern in a plan view.

Referring to FIGS. 1 and 2 again, a fourth insulating interlayer may be formed on the fourth insulation pattern 240, the channel structure, the gate insulation pattern 225, the gate electrode 235 and the etch stop pattern 600 to cover the contact plug 270, and an upper portion of the fourth insulating interlayer may be planarized until an upper surface of the contact plug 270 is exposed to form a fourth insulating interlayer pattern 280 covering a sidewall of the contact plug 270.

A first capacitor electrode 290 may be formed to contact the upper surface of the contact plug 270, a dielectric layer 300 may be formed on an upper surface and a sidewall of the first capacitor electrode 290 and an upper surface of the fourth insulating interlayer pattern 280, and a second capacitor electrode 310 may be formed on the dielectric layer 300 to form a capacitor 320.

Thus, the fabrication of the semiconductor device may be completed.

As illustrated above, the etch stop pattern 600 may be formed on the second insulating interlayer pattern 160, the channel layer 210 may be formed on the etch stop pattern 600, and may be partially etched to form the amorphous channel 215 by an etching process. Thus, the second insulating interlayer pattern 160 may be covered by the etch stop pattern 600, so that a height of the upper surface of the second insulating interlayer pattern 160 may remain during the etching process.

Additionally, the amorphous channel 215 may contact the etch stop pattern 600 including hydrogen, and the gate insulation layer 220 and the gate electrode layer 230 may be formed by a deposition process at a relatively high temperature. Thus, during the deposition process, hydrogen contained in the etch stop pattern 600 may diffuse into the amorphous channel 215 to expedite the crystallization of the amorphous oxide semiconductor and increase the carrier concentration.

As a result, a portion of the amorphous channel 215 may be converted into the crystalline channel 212 having a relatively large grain size, and the crystalline channel 212 may have an increased carrier concentration. Thus, the channel structure including the crystalline channel 212 may have an increased on-current.

Figure 17:
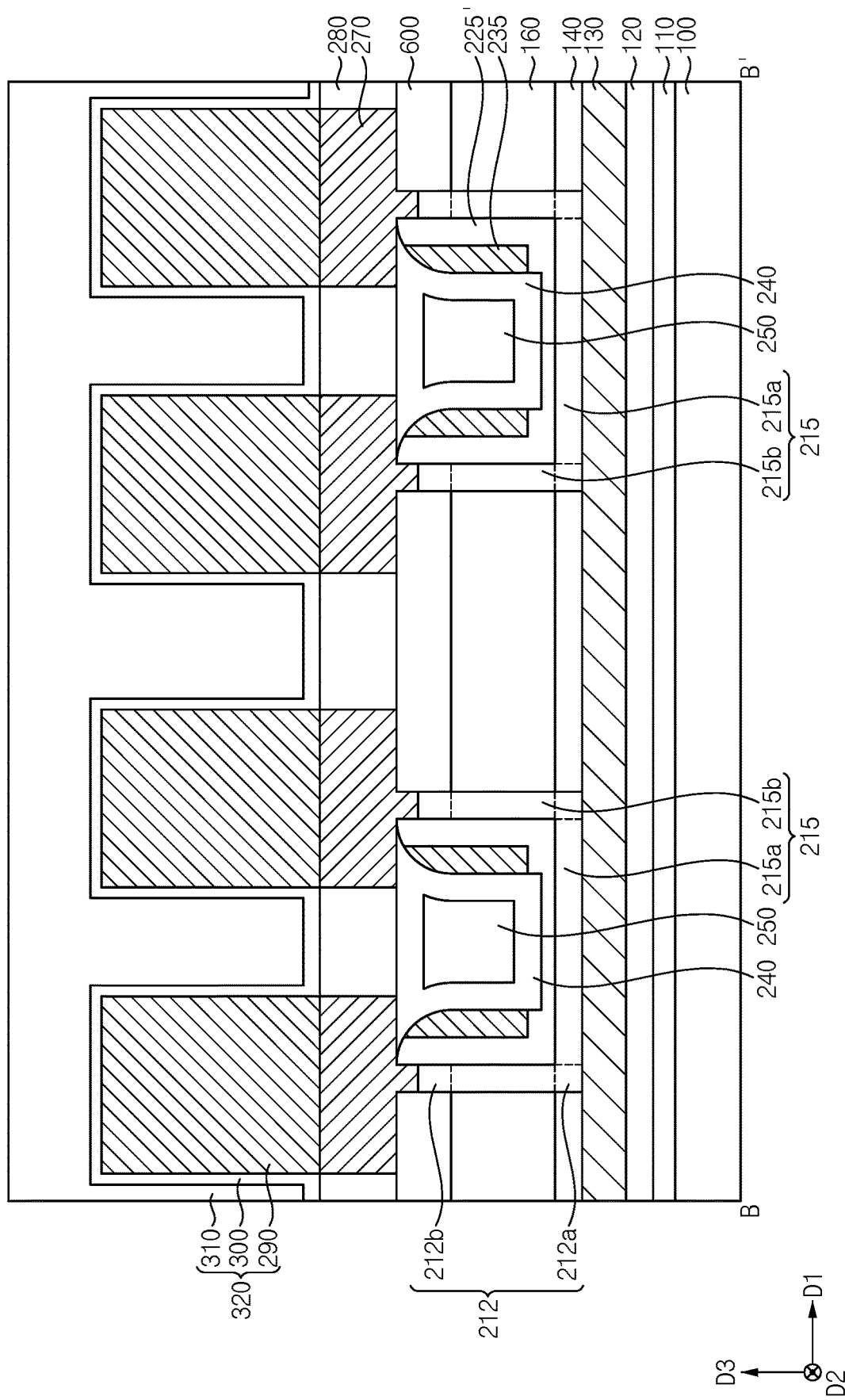
FIG. 17 is a cross-sectional view illustrating a semiconductor device in accordance with example embodiments.

FIG. 17 is a cross-sectional view illustrating a semiconductor device in accordance with example embodiments, which may correspond to FIG. 2. This semiconductor device may be the same as or similar to that of FIGS. 1 and 2, except for the gate insulation pattern, and thus repeated explanations are omitted herein.

Referring to FIG. 17, the gate insulation pattern 225' may also be formed on an upper surface of the horizontal portion 215a of the amorphous channel 215, and a cross-section of the gate insulation pattern 225' in the first direction D1 may have a cup shape instead of an "L" shape.

For example, the gate insulation patterns 225 shown in FIGS. 1 and 2 may be formed at opposite sides, respectively, of the fourth insulation pattern 240 in the first direction D1, while the gate insulation patterns 225' shown in FIG. 17 at opposite sides of the fourth insulation pattern 240 may be connected to each other through a portion between the fourth insulation pattern 240 and the horizontal portion 215a in the third direction D3 to form a single structure.

In example embodiments, the gate insulation patterns 225 shown in FIGS. 1 and 2 may be separately formed between two adjacent bar structures in the first direction D1 as a pair structure, and the gate insulation patterns 225' shown in FIG. 17 may be formed between two adjacent bar structures in the first direction D1 as a single structure.

Figure 18:
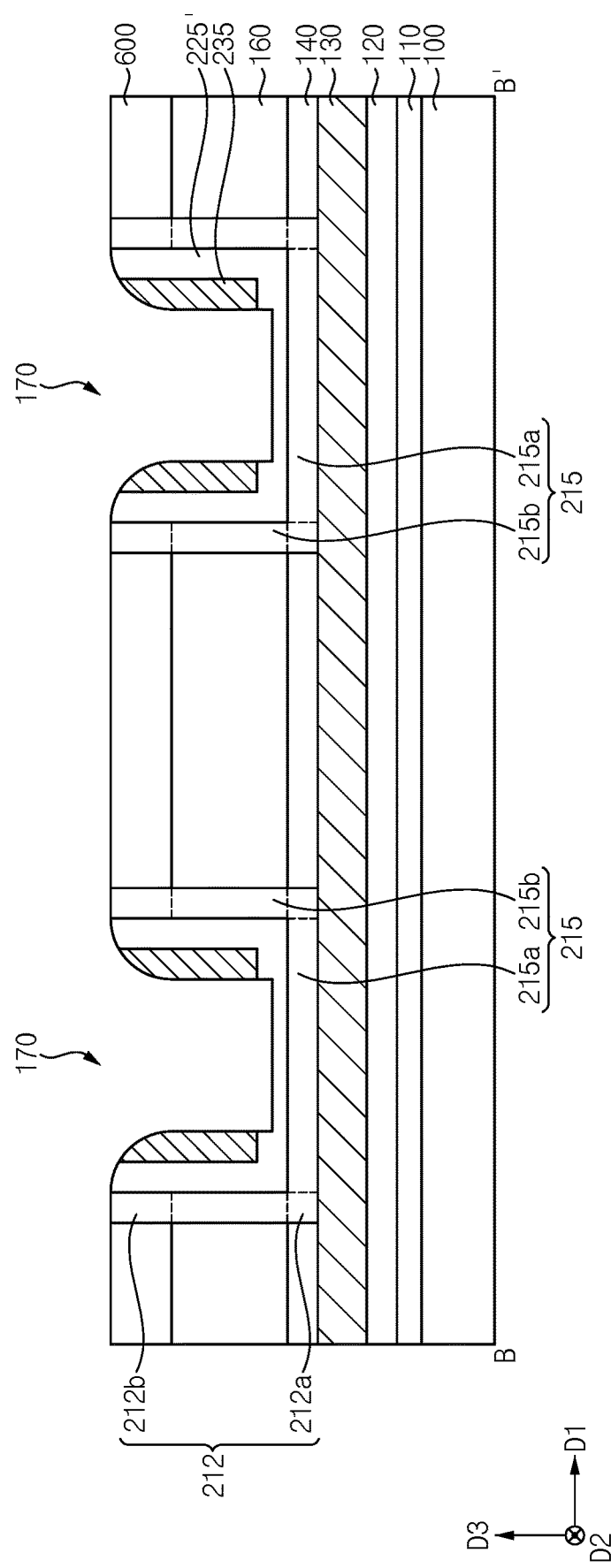
FIG. 18 is a cross-sectional view illustrating a method of manufacturing a semiconductor device in accordance with example embodiments.

FIG. 18 is a cross-sectional view illustrating a method of manufacturing a semiconductor device in accordance with example embodiments, which may correspond to FIG. 12. This method may include processes the same as or similar to those of FIGS. 3 to 16 and FIGS. 1 and 2, and thus repeated explanations thereof are omitted herein.

Referring to FIG. 18, processes the same as those of FIGS. 3 to 10 may be performed, and processes the same as or similar to those of FIGS. 11 to 12 may be performed.

However, the gate insulation pattern 225' that may be formed by an anisotropic etching process on the gate insulation layer 220 may also be formed on an upper surface of the horizontal portion 215a of the amorphous channel 215 in addition to the sidewall of the second opening 170.

For example, in the anisotropic etching process, a portion of the gate insulation layer 220 on the upper surface of the horizontal portion 215a of the amorphous channel 215 may not entirely removed but partially remain. Thus, a cross-section of the gate insulation pattern 225' in the first direction D1 may have a cup shape instead of an "L" shape.

After the gate electrode 235 and the gate insulation pattern 225 having a cup shape shown in FIG. 18 are formed, processes the same as or similar to those illustrated with reference to FIGS. 13 to 16 and FIGS. 1 and 2 may be performed to complete the fabrication of the semiconductor device.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
   bit lines on a substrate, each of the bit lines extending in a first direction parallel to an upper surface of the substrate, and the bit lines being spaced apart from each other in a second direction parallel to the upper surface of the substrate and crossing the first direction;
   gate electrodes spaced apart from each other in the first direction, each of the gate electrodes extending in the second direction;
   for each of the gate electrodes:
      a gate insulation pattern on a sidewall in the first direction of the gate electrode; and
      a channel structure on a sidewall in the first direction of the gate insulation pattern,
   wherein the channel structure includes:
   a first amorphous channel including an amorphous oxide semiconductor; and
   a first crystalline channel including a crystalline oxide semiconductor and contacting an upper surface of the first amorphous channel.

2. The semiconductor device according to claim 1, wherein the first crystalline channel includes hydrogen.

3. The semiconductor device according to claim 1, further comprising, for each channel structure, a second crystalline channel including a crystalline oxide semiconductor and contacting a lower surface of the first amorphous channel.

4. The semiconductor device according to claim 3, further comprising, for each channel structure, a second amorphous channel including an amorphous oxide semiconductor, the second amorphous channel contacting an upper surface of each of the bit lines and being connected to the second crystalline channel.

5. The semiconductor device according to claim 3, further comprising an insulation pattern on each of the bit lines, the insulation pattern contacting a sidewall of each second crystalline channel and including an insulating material containing hydrogen.

6. The semiconductor device according to claim 1, wherein each first crystalline channel overlaps each of the gate electrodes in the first direction.

7. The semiconductor device according to claim 1, further comprising:
   an insulating interlayer pattern and an etch stop pattern on a sidewall in the first direction of each channel structure, the insulating interlayer pattern and the etch stop pattern stacked in a third direction perpendicular to the upper surface of the substrate,
   wherein the etch stop pattern includes silicon nitride, silicon oxynitride, silicon oxycarbonitride or silicon oxycarbide.

8. The semiconductor device according to claim 7, wherein the etch stop pattern includes hydrogen.

9. The semiconductor device according to claim 7, wherein a lower surface of the etch stop pattern is coplanar with a lower surface of the first crystalline channel.

10. The semiconductor device according to claim 1, further comprising:
    a contact plug contacting an upper surface of the channel structure at each of areas where the bit lines and the gate electrodes overlap in a third direction perpendicular to the upper surface of the substrate; and
    a capacitor on the contact plug.

11. The semiconductor device according to claim 10, wherein the contact plug includes a lower portion contacting the upper surface of the channel structure and having a first width in the first direction and an upper portion contacting the lower portion and having a second width in the first direction greater than the first direction, and
    wherein a lower surface of the contact plug is lower than an upper surface of the gate insulation pattern.

12. A semiconductor device comprising:
    bit lines on a substrate, each of the bit lines extending in a first direction parallel to an upper surface of the substrate, and the bit lines being spaced apart from each other in a second direction parallel to the upper surface of the substrate and crossing the first direction;
    gate electrodes spaced apart from each other in the first direction, each of the gate electrodes extending in the second direction;
    a gate insulation pattern on a sidewall in the first direction of each of the gate electrodes;
    a channel structure on a sidewall in the first direction of each of the gate insulation patterns; and
    an insulating interlayer pattern and an etch stop pattern on a sidewall in the first direction of each of the channel structures, the insulating interlayer pattern and the etch stop pattern stacked in a third direction perpendicular to the upper surface of the substrate,
    wherein each etch stop pattern includes an insulting material containing hydrogen.

13. The semiconductor device according to claim 12, wherein each etch stop pattern includes silicon nitride, silicon oxynitride, silicon oxycarbonitride or silicon oxycarbide.

14. The semiconductor device according to claim 12, wherein each channel structure includes:
    a first amorphous channel including an amorphous oxide semiconductor; and
    a first crystalline channel including a crystalline oxide semiconductor and contacting an upper surface of the first amorphous channel.

15. The semiconductor device according to claim 14, wherein a lower surface of each etch stop pattern is coplanar with a lower surface of a respective first crystalline channel.

16. The semiconductor device according to claim 15, further comprising, for each channel structure:
- a second crystalline channel including a crystalline oxide semiconductor and contacting a lower surface of the first amorphous channel; and
- a second amorphous channel including an amorphous oxide semiconductor, the second amorphous channel contacting an upper surface of each of the bit lines and being connected to the second crystalline channel.

17. The semiconductor device according to claim 16, further comprising an insulation pattern on each of the bit lines, the insulation pattern contacting a sidewall of a second crystalline channel and including an insulating material containing hydrogen.

18. The semiconductor device according to claim 14, wherein each first crystalline channel at least partially overlaps a respective gate electrode in the first direction.

19. A semiconductor device comprising:
- bit lines on a substrate, each of the bit lines extending in a first direction parallel to an upper surface of the substrate, and the bit lines being spaced apart from each other in a second direction parallel to the upper surface of the substrate and crossing the first direction;
- gate electrodes spaced apart from each other in the first direction, each of the gate electrodes extending in the second direction;
- a gate insulation pattern on a sidewall in the first direction of each of the gate electrodes;
- a channel structure on a sidewall in the first direction of each of the gate insulation patterns;
- an insulating interlayer pattern and an etch stop pattern on a sidewall in the first direction of each of the channel structures, the insulating interlayer pattern and the etch stop pattern stacked in a third direction perpendicular to the upper surface of the substrate;
- a contact plug contacting an upper surface of each of the channel structures; and
- a capacitor on the contact plug,
wherein each channel structure includes:
- a first amorphous channel including an amorphous oxide semiconductor;
- a first crystalline channel including a crystalline oxide semiconductor and contacting an upper surface of the first amorphous channel;
- a second crystalline channel including a crystalline oxide semiconductor and contacting a lower surface of the first amorphous channel; and
- a second amorphous channel including an amorphous oxide semiconductor, the second amorphous channel contacting an upper surface of each of the bit lines and being connected to the second crystalline channel.

20. The semiconductor device according to claim 19, wherein the first and second crystalline channels and each etch stop pattern include hydrogen.

* * * * *